United States Patent [19]

Barnett et al.

[11] Patent Number: 5,053,319

[45] Date of Patent: Oct. 1, 1991

[54] AQUEOUS SOLUTIONS OF OLEOPHILIC COMPOUNDS

[75] Inventors: Anthony M. Barnett, Bushey; Jeffrey K. Green, Harrow, both of United Kingdom

[73] Assignee: Eastman Kodak Company, Rochester, N.Y.

[21] Appl. No.: 653,758

[22] Filed: Feb. 11, 1991

Related U.S. Application Data

[63] Continuation of Ser. No. 473,986, filed as PCT GB89/01145 on Sep. 28, 1989, published as WO90/03600 on Apr. 5, 1990, abandoned.

[30] Foreign Application Priority Data

Sep. 28, 1988 [GB] United Kingdom ................ 8822746

[51] Int. Cl.$^5$ ............................................. G03C 5/38
[52] U.S. Cl. .................................... 430/331; 430/204; 430/302; 101/466; 106/1.11
[58] Field of Search ....................... 430/204, 302, 331; 101/466; 106/1.11

[56] References Cited

U.S. PATENT DOCUMENTS

| | | | |
|---|---|---|---|
| 3,186,842 | 6/1965 | Haes et al. | 430/204 |
| 3,300,306 | 1/1967 | Sevens et al. | 430/204 |
| 3,567,443 | 3/1971 | Haes | 430/204 |
| 3,819,374 | 6/1974 | Kemp | 430/204 |
| 4,567,131 | 1/1986 | Watkins | 430/331 |
| 4,576,743 | 3/1986 | Kita et al. | 430/331 |

FOREIGN PATENT DOCUMENTS

| | | |
|---|---|---|
| 1271225 | 4/1972 | United Kingdom . |
| 2095620 | 10/1982 | United Kingdom . |
| 2146582 | 4/1985 | United Kingdom . |

*Primary Examiner*—Hoa Van Le
*Attorney, Agent, or Firm*—Alfred P. Lorenzo

[57] ABSTRACT

An aqueous lithographic conditioner solution or fix composition for use with lithographic plates made by the silver salt diffusion transfer process comprises (a) an oleophilic argentophile, (b) a quaternary ammonium surfactant and (c) a quaternary ammonium surfactant solubilized by the addition of alkyleneoxy units, the proportions and nature of the components being such as to provide the desired solution.

7 Claims, No Drawings

AQUEOUS SOLUTIONS OF OLEOPHILIC COMPOUNDS

This is a continuation of application Ser. No. 473,986, filed as PCT GB89/01145 on Sep. 28, 1989, published as WO90/03600 on Apr. 5, 1990, now abandoned.

The invention relates to aqueous solutions of normally water-insoluble oleophilic compounds and in particular to aqueous solutions useful in lithography.

It is sometimes necessary to treat images on lithographic printing plates to make them more receptive to oily printing ink. Generally this involves making an oleophilic compound bind itself to the image areas of the plate but not to the background areas. Often a cationic surfactant is present to reinforce the oleophilic character of the treated image.

Such a situation occurs with printing plates made by the photographic silver salt diffusion transfer process. Such plates may, for example, comprise a silver image on an anodised aluminum support or a silver image-bearing gelatinous layer on a resin-coated paper support. In each case a solution is applied to render the silver image oleophilic. Such solutions are usually referred to as a conditioner (paper plates) or a fix (metal plates). The compound which converts the silver image to an ink-receptive image is called an oleophilic argentophile.

Because of the solubility characteristics of both oleophilic argentophiles and cationic surfactants it has been customary to use a mixed solvent (part aqueous and over 60% organic) in order to bring them into solution. Organic solvents are not desirable as they may be unpleasant to use and cause environmental problems on disposal.

British Specification 2,146,582 describes the use of a cationic surfactant, e.g. a polyethoxylated quaternised amine or amide, to bring the argentophile into solution in a wholly aqueous environment. Such a solution is, however, not completely satisfactory with all types of printing plate under all possible conditions.

The present invention provides a combination of three compounds which together can form a solution in water.

According to the present invention there is provided an aqueous solution comprising (a) an oleophilic argentophile, (b) a quaternary ammonium surfactant and (c) a quaternary ammonium surfactant solubilised by the addition of alkyleneoxy units, the proportions and nature of the components being such as to provide the desired solution.

Without wishing to be bound by any theory on the mechanisms involved, it is believed that the quaternary salt and the argentophile form an electrostatic pair which tends to screen the positive charge on the amine and allow its oleophilic tail and that of the similarly affected ethoxylated surfactant to form more effective micelles.

The present solution may take the form of a lithographic conditioner or fix composition for use with lithographic plates made by the silver salt diffusion transfer process. It can be made stable and effective under all normal conditions of use.

In selecting components (a) and (b) the properties required in the final solution should be primarily borne in mind regarding the nature of the compounds and their concentrations. Compound (c) is then selected with a view to forming a stable solution.

The component (a) comprises a group which is adsorbed strongly to silver and a hydrocarbon group large enough to provide the desired oleophilic properties. The compounds may have some solubility in pure water but in aqueous lithographic conditioner and fix solutions they are essentially insoluble. Examples of (a) are well known in the art and include 1-phenyl-5-mercaptotetrazole, 3-mercapto-4-acetamido-5-n-heptyl-1,2,4-triazole, 2-mercaptobenzothiazole and bis-2-mercaptothiadiazines.

The component (b) may be a quaternary ammonium compound which contains large enough hydrocarbon groups to render it useful in increasing the lipophilic nature of the treated image. Examples of such compounds include cetyltrimethylammonium chloride.

The preferred components (c) are compounds of the formula:

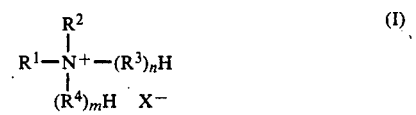

wherein
$R^1$ is an aliphatic hydrocarbon group,
$R^2$ is an aliphatic hydrocarbon group or $-(R^5)_pH$,
$R^3$, $R^4$ and $R^5$ are each alkyleneoxy groups,
n, m and p are together greater than 5, preferably 10–20,
$X^-$ is an anion,
and wherein the carbon atoms contained by $R^1$ and $R^2$ (if a hydrocarbon group) are together more than 12, preferably from 12 to 20.

If $R^1$ and $R^2$ are both hydrocarbon groups, preferably one of them is longer than the other, for example $R^1$ could contain 12–20 carbon atoms and $R^2$ be methyl.

Preferably, the alkyleneoxy units are ethyleneoxy and/or glycidyl units. The units may be added to the parent amine by a reaction with the appropriate epoxide.

Specific examples of such compounds are sold under the trade names Ethoquad C25, and Ethoquad HT/25. Their structures are believed to be as follows:

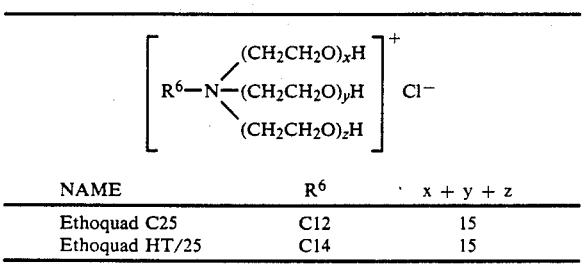

| NAME | $R^6$ | x + y + z |
|---|---|---|
| Ethoquad C25 | C12 | 15 |
| Ethoquad HT/25 | C14 | 15 |

In a preferred method of preparing the present solutions an ethoxylated long chain quaternary ammonium compound is first dissolved in water. The required amounts of the traditional oleophile and argentophile may then be added. These will now dissolve rapidly and completely. The solution is now relatively stable to the additions of further compounds that may be used in the formula being prepared. If desired the other components can be added before the ethoxylated compound provided this precedes the additions of the two harder to dissolve compounds. For maximum stability and to allow the highest possible concentrations of the active ingredients all three components (a), (b) and (c) need to be present.

When the present solutions are employed as lithographic conditioner or fix solutions for printing plates made by the silver salt diffusion transfer process, the fix solutions used for metal (usually aluminium) plates may, as is known, also contain a hydrophilic colloid, (e.g. gelatin, gum arabic or carboxymethylcellulose), nitrate ions and a minor amount of an organic humectant, e.g. hexylene glycol.

The conditioner solution, as is known, may also contain a silver oxidising agent, e.g. sodium ferric EDTA or other oxidising compounds referred to in British Patent Specification 2,095,620. The solution preferably also contains an acid, iodide ions and a silver halide solvent.

The following examples are included for a better understanding of the invention.

EXAMPLE 1

A conditioner solution is prepared by adding the following ingredients to a liter of water in the order given.

| Ethoquad C25 | 6.0 g |
|---|---|
| 1-phenyl-5-mercaptotetrazole | 2.8 g |
| Cetyltrimethylammonium bromide | 1.5 g |
| Sodium ferric EDTA | 40.0 g |
| Potassium iodide | 5.5 g |
| Potassium Thiocyanate | 1.0 g |
| Acetic acid | 20.0 ml |
| Sodium Acetate | to pH 4.0 |

This aqueous solution is stable and has been tested under a number of different conditions and it has proved fully effective in all cases tested.

EXAMPLE 2

A fix solution is prepared by adding the following ingredients to a liter of water in the order given.

| Ethoquad C25 | 3 g |
|---|---|
| 1-phenyl-5-mercaptotetrazole | 2 g |
| Cetyltrimethylammonium chloride | 2 g |
| Citric Acid | 1 g |
| Ammonium Nitrate | 4 g |
| Carboxymethyl-cellulose | 12 g |
| Hexylene glycol | 100 ml |
| (pH = 4) | |

This is a stable solution and has proved fully effective under all conditions tested.

We claim:

1. An aqueous solution capable of serving as a lithographic conditioner or lithographic fixing composition for use with lithographic plates prepared by the silver salt diffusion transfer process; said solution being free of organic solvents and consisting essentially of (a) about 2 to about 2.8 grams per liter of 1-phenyl-5-mercaptotetrazole, (b) about 1.5 to about 2 grams per liter of a quaternary ammonium surfactant that is free of alkyleneoxy groups, and (c) about 3 to about 6 grams per liter of a quaternary ammonium surfactant comprising alkyleneoxy groups.

2. An aqueous solution as claimed in claim 1 wherein component (b) is cetyltrimethylammonium chloride.

3. An aqueous solution as claimed in claim 1 wherein the alkyleneoxy groups of component (c) are ethyleneoxy groups.

4. An aqueous solution as claimed in claim 1 wherein the alkyleneoxy groups of component (c) are glycidyl groups.

5. An aqueous solution as claimed in claim 1 wherein component (c) has the formula:

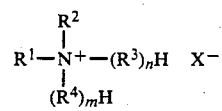

wherein
$R^1$ is an aliphatic hydrocarbon group;
$R^2$ is an aliphatic hydrocarbon group or an $(R^5)_pH$ group;
$R^3$, $R^4$ and $R^5$ are each an alkyleneoxy group;
n, m and p, taken together, have a value greater than 5 and up to 20; and
$X^-$ is an anion;
with the proviso that when $R^2$ is an aliphatic hydrocarbon group, the number of carbon atoms in $R^1$ and $R^2$, taken together, is greater than 12 and up to 20.

6. An aqueous solution as claimed in claim 1 wherein component (c) has the formula:

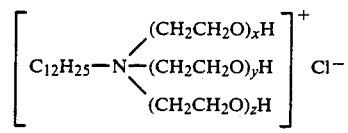

wherein the sum of $x+y+z$ is equal to 15.

7. An aqueous solution as claimed in claim 1 wherein component (c) has the formula:

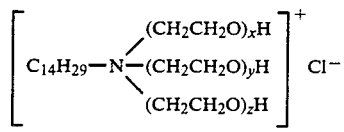

wherein the sum of $x+y+z$ is equal to 15.

* * * * *